United States Patent
Nishiumi et al.

(10) Patent No.: US 6,754,552 B2
(45) Date of Patent: Jun. 22, 2004

(54) CONTROL APPARATUS FOR PLASMA UTILIZING EQUIPMENT

(75) Inventors: Masaharu Nishiumi, Kudamatsu (JP); Hiromichi Enami, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 220 days.

(21) Appl. No.: 09/797,579

(22) Filed: Mar. 5, 2001

(65) Prior Publication Data

US 2002/0052668 A1 May 2, 2002

(30) Foreign Application Priority Data

Oct. 30, 2000 (JP) .......................................... 2000-331090
Oct. 30, 2000 (JP) .......................................... 2000-331092

(51) Int. Cl.$^7$ ............................................. G06F 19/00
(52) U.S. Cl. ........................ 700/121; 438/9; 438/485; 438/513; 438/680
(58) Field of Search ....................... 700/121, 48; 438/9, 438/474, 475, 485, 513, 709, 710, 788, 798, 680

(56) References Cited

U.S. PATENT DOCUMENTS

| 5,556,501 A | * | 9/1996 | Collins et al. .......... 156/345.38 |
| 5,841,651 A | * | 11/1998 | Fu ............................... 700/48 |
| 5,971,591 A | | 10/1999 | Vona et al. |
| 5,990,000 A | * | 11/1999 | Hong et al. ................. 438/631 |
| 6,123,983 A | * | 9/2000 | Smith et al. ................ 700/121 |

* cited by examiner

Primary Examiner—Leo Picard
Assistant Examiner—Charles Kasenge
(74) Attorney, Agent, or Firm—Antonelli, Terry, Stout & Kraus, LLP (57) ABSTRACT

A plurality of measuring devices to obtain numerical information necessary for control in process control of plasma utilizing equipment are connected to a first communication link, a plurality controllers to conduct numerical operations according to the numerical information are connected to a second communication link, and a plurality of control devices to receive control numerical information generated by the controllers to conduct necessary control.

13 Claims, 3 Drawing Sheets

CONTROL APPARATUS FOR PLASMA UTILIZING EQUIPMENT

BACKGROUND OF THE INVENTION

The present invention relates to a control apparatus and a control method for use with plasma utilizing equipment, and in particular, to a control apparatus and a control method for use with plasma utilizing equipment capable of achieving control of the plasma utilizing equipment at a high speed with high precision.

A control apparatus for a plasma chemical vapor deposition (CVD) facility, a plasma doping device, a sputtering unit, and the like includes a member state detecting section to detect a state of a member to be processed, a plasma probe to detect the state of plasma, a utility monitor to detect a state of consumption of utility, and the like and supplies numerical information items measured by various kinds of measuring devices to a controller. Having received the numerical information, the controller executes arithmetic processing for the information to generate control numerical information and controls control devices and the like of the plasma control apparatus according to the information.

Characteristics of plasma in the plasma utilizing equipment have not been completely clarified yet. Therefore, it is difficult to control process parameters of the plasma utilizing equipment in association with changes in process characteristics. The plasma utilizing equipment of the prior art adopts a method in which process parameters set at start of production are kept unchanged.

On the other hand, in plasma utilizing equipment including a reactor to fabricate semiconductor devices, a state of the reactor changes during the fabrication due to reactive products and the like accumulated in the reactor and hence plasma processing characteristics change with lapse of time. To cope with the changes in the plasma processing characteristics, the reactor must be opened to be cleaned or the reactor must be initialized by replacing parts.

SUMMARY OF THE INVENTION

With recent increase in the density and the degree of integration of semiconductor devices, high-precision work or machining is required in semiconductor device manufacturing processes. Particularly, in plasma utilizing equipment, the machining precision decreases due to fluctuation of plasma. Therefore, it is essential to exactly control quantity of energy to be supplied to the plasma utilizing equipment and various utilities thereof.

To control plasma with high precision, there is required a controller having high processing capability. In some cases, processing capability of one controller is insufficient and hence delay takes place in the control operation. On the other hand, there is known a method using a plurality of intermediate controllers in which the various measuring devices are classified into a plurality of groups respectively assigned to the intermediate controllers. In this method, it is difficult for a controller corresponding to one group to complementarily or associatively use numerical information measured by measuring devices of other groups.

Recently, a concept of an auto process control (APC) has been introduced to control apparatuses of plasma utilizing equipment. According to APC, attempts have been conducted to achieve process control using various measuring devices. However, interactions exist between process parameters to determine a state of plasma processing and a relationship of tradeoff may exist therebetween. Therefore, in the plasma utilizing equipment, effective process control has not been yet achieved as described above.

In a method to carry out the control operation using a mutivariate analysis, it is required to control a plurality of process parameters for one process characteristic. This requires complicated arithmetic operations, and a large volume of work or processing is necessary to prove or to verify results of the operations. Consequently, it is difficult to practically use this control method.

It is therefore an object of the present invention, which has been devised to remove the difficulty, to provide a control apparatus and a control method for use with plasma utilizing equipment in which numerical information items measured by measuring devices can be complementarily and associatively used and the control operation can be accomplished at a high speed with high precision.

Another object of the present invention is to provide a control apparatus and a control method for use with plasma utilizing equipment in which the control operation can be effectively carried out even when interactions exist between process parameters.

To solve the aforesaid problem of the conventional techniques, according to an aspect of the present invention, there is provided a control apparatus for plasma utilizing equipment including first, second, and third communication links which are connected to each other; a plasma detecting section connected to said first communication link for detecting a state of plasma generated in a vacuum chamber of said plasma utilizing equipment, a member state detecting section connected to said first communication link for detecting a state of a member to be processed, said member being disposed in said vacuum chamber; a utility detecting section connected to said first communication link for detecting a state of a utility of said plasma utilizing equipment; a plurality of controllers each connected to said second communication link for generating control information for controlling energy to be supplied to said plasma utilizing equipment or a utility of said plasma utilizing equipment according to detected information detected by at least one of said plasma detecting section, said member state detecting section, and said utility detecting section; an energy control device connected to said third communication link for controlling energy to be supplied to said plasma utilizing equipment according to the control information, and a utility control device connected to said third communication link for controlling said utility according to the control information.

According to the aspect of the present invention, a plurality of measuring devices to acquire numerical information necessary for the operation of the process control of the plasma utilizing equipment are connected to the first communication link, a plurality of controllers to conduct numerical calculations according to the numerical information are connected to the second communication link, and a plurality of controllers to receive control numerical information generated by the controllers and to accomplish necessary control operations are connected to the third communication link.

As above, since a plurality of controllers are connected to the shared link and the input devices and the output devices are connected to mutually different links in the configuration, the controllers can freely receive numerical information from the various measuring devices to execute concurrent processing and hence the processing of operations can be executed at a high speed with high precision.

According to an example of the present invention, at least one of said controllers includes an extracting section for extracting detected information which primarily influences only predetermined process characteristics and a control information generating section for generating control information for controlling energy to be supplied to said plasma utilizing equipment or a utility of said plasma utilizing equipment according to the detected information extracted by said detecting section.

The selected process parameters are controlled as above so that interactions are minimized between a plurality of process parameters hindering the stability and the process efficiency of the plasma processing, and hence the initial process characteristics can be kept retained for a long period of time. In this respect, the process parameter means control variables for executing the process and the process characteristics means working characteristics obtained by the execution of the process.

BRIEF DESCRIPTION OF THE DRAWINGS

The present invention will be more apparent from the following detailed description, when taken in conjunction with the accompanying drawings, in which.

DESCRIPTION OF THE EMBODIMENTS

Referring to the accompanying drawings, description will be given of embodiments of a control apparatus and a control method for use with plasma utilizing equipment such as a plasma CVD system, a plasma doping facility, and a sputtering apparatus. In respective embodiments, the same constituent components as those of a first embodiment will be assigned with the same reference numerals and duplicated description thereof will be avoided.

Figure 1:
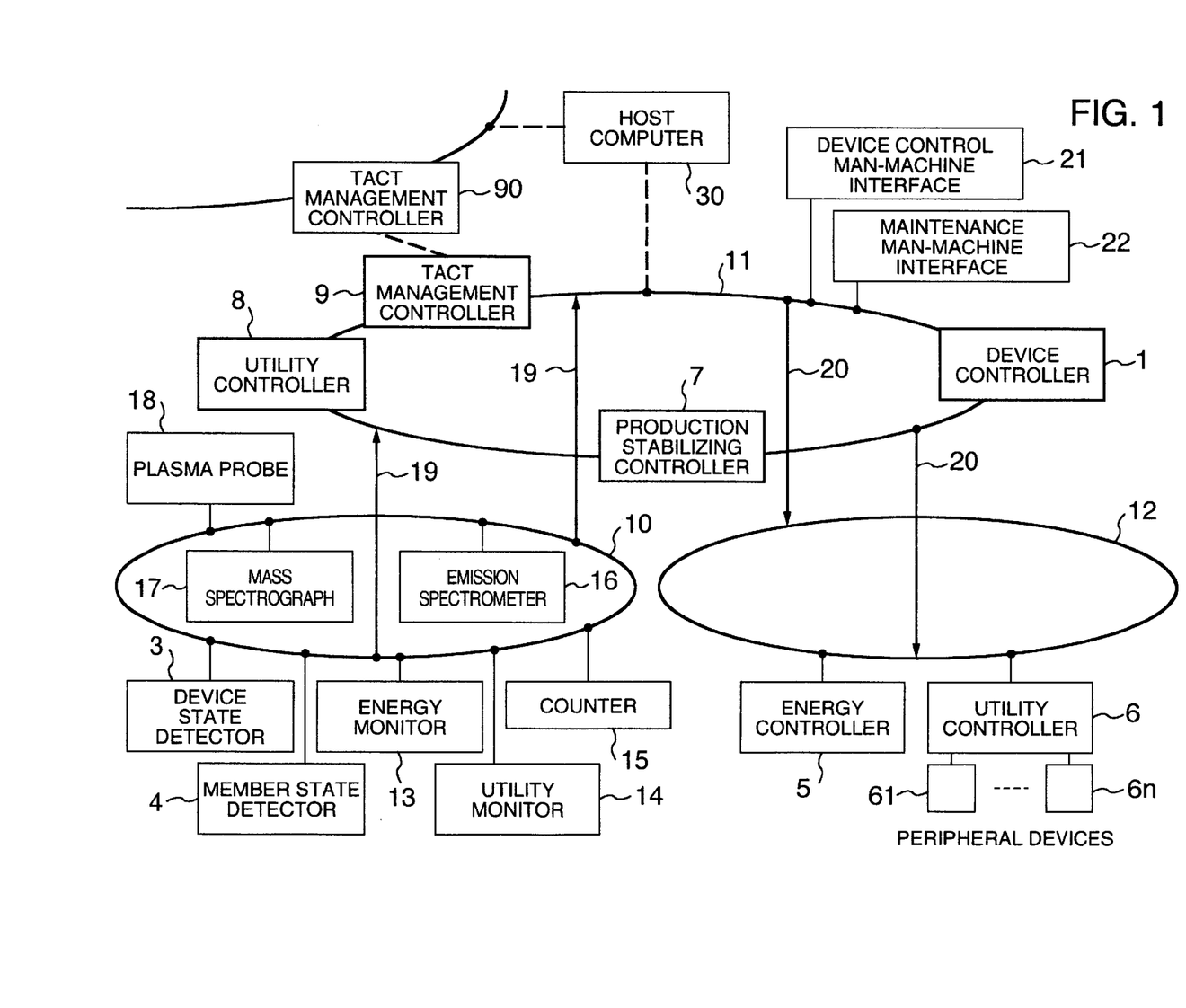
FIG. 1 is a diagram showing a first embodiment of a control apparatus of plasma utilizing equipment in accordance with the present invention.

FIG. 1 shows a configuration of a first embodiment of a control apparatus for use with plasma utilizing equipment in accordance with the present invention.

The configuration of FIG. 1 includes first to third communication links 10 to 12 in which the first communication link 10 is mutually connected via the second communication link 11 to the third communication link 12. The system further includes a device controller 1 to control a plasma processing apparatus, a device state detecting section (also called as a plasma detecting section for detecting a state(s) of the plasma) 3 including a sensor(s) and the like to detect a state(s) of the plasma processing apparatus (for example, gas pressure in a vacuum chamber and fluctuation of plasma), a member state detecting section 4 including a sensor(s) and the like to detect a state(s) of a member such as a wafer to be processed (for example, values of positions, temperature, and a processing speed of the member), and an energy controller 5 to control energy to be supplied to the plasma processing apparatus. The configuration of FIG. 1 further includes n utility devices 61–6n (n is an integer equal to or more than one) as peripheral devices of the plasma processing apparatus, a utility control device 6 to control the utility devices 61 to 6n, a production stabilizing controller 7 to control a plasma processing process and processes before and after the plasma processing process, a utility controller 8 to control the utility control devices 6, and a tact management controller 9 to control, in cooperation with other various processing apparatuses (a dry etching system, a plasma CVD facility, etc.), operations of the controllers and the processing apparatuses. The utilities are, for example, gases to be introduced to the vacuum chamber, exhaust gas therefrom, and cooling water. The peripheral devices (utility devices) 61–6n are devices to control utilities under supervision of the utility control device 6 such as a gas supplier, a cooling water supplier, and a vacuum pump.

In the system, there is also arranged an energy monitor section 13 to monitor quantity of energy supplied to, for example, a plasma generator and/or an antiliary device(s) such as a cooling system of the plasma generator, a utility monitor section 14 to measure utility states (for example, a flow rate of gases introduced to the vacuum chamber, gas pressure in the vacuum chamber, and a gas exhausting flow rate of the vacuum chamber), and a counter 15 to count, for example, the number of used members such as wafers or dummy wafers. Additionally, in a reaction chamber or in the vicinity thereof, there are disposed an emission spectrometer 16 to analyze emission associated with reactive products produced by plasma processing and a mass spectrograph 17 to analyze reactive products produced by plasma processing. The system further includes a plasma probe 18, a communication line 19 to connect the first communication link 10 to the second communication link 11, and a communication line to connect the second communication link 11 to the third communication link 12. Also disposed in the system are a device control man-machine interface 21 for an operator to input processing conditions (an etching condition and the like) of the plasma processing apparatus, a maintenance man-machine interface 22 for maintenance (such as a transportation test of a wafer transporter) of the plasma processing apparatus, and a host computer 30 to conduct overall control for a plurality of semiconductor manufacturing apparatuses. The host computer 30 controls, for example, information of devices in a production line, information of members to be processed, and manufacturing information. The system further includes a tact management controller 90 connected to another link to control other semiconductor manufacturing apparatuses (a dry etching system, a plasma CVD facility, and the like).

As shown in FIG. 1, the first communication link 10 is connected, for example, to the device state detector 3, the member state detector 4, the energy monitor 13, the utility monitor 14, the mass spectrograph 17, the emission spectrometer 16, and the plasma probe 18. Information of measurement (detection) obtained by these measuring devices is transmitted via the communication line 19 to the second communication link 11.

The second communication link 11 is connected, for example, to the controllers such as the device controller 1, the production stabilizing controller 7, the utility controller 8, and the tact management controller 9. These controllers receive information of measured values from the second communication link 11 and generates control numerical information (control information) for the respective control devices according to the received information.

The third communication link 12 is connected, to the energy controller 5 and the utility control device 6. These controllers receive the control numerical information and controls the energy controller and the peripheral devices.

The device controller 1, the production stabilizing controller 7, the utility controller 8, and the tact management controller 9 receive information of measured value respectively from the measuring devices connected to the first communication link 10 and executes processing of predetermined operations for the information to produce numerical control information. These controllers control the energy controller 5 and the utility controller 6 according to the numerical control information and transmit information resultant from the processing to the other controllers. Having received the information, the other controllers can execute processing of operations to generate again the numerical control information. The tact management controller 9 communicates the information resultant from the processing with the other task management controller 90 to control proceeding of the processes.

According to the construction of the present embodiment, it is possible to achieve a distributed control operation by a controller (computer). The communication link is not limited to the loop form shown in the drawings, but may be in a form like a line or any other form.

Description will next be given of an example in which the present embodiment of the control apparatus for plasma utilizing equipment is applied to a dry etching facility to fabricate a poly-silicon (poly-Si) gate electrode. It is known that when processing of poly-silicon wafers is continuously executed by a dry etching system, one of the process characteristics, i.e., an etching speed is decreased.

Factors exerting influence upon the process characteristics are, for example, ① components of gas from reactive products accumulated by the processing in a reactor (vacuum chamber), ② reduction in an effective ground area of high-frequency discharge due to the accumulated reactive products, ③ change in impedance of an electrode and/or a reactor wall on which the reactive products are fixed, ④ quite small change of gas pressure due to increase in temperature of respective sections of the reactor, ⑤ change in impedance with respect to wafer bias due to the reactive products are fixed on an electrode surface on which a wafer is mounted, and ⑥ change of high-frequency output due to increase in temperature of atmosphere and/or the reactor. The device state detector 3 and the like can detect these factors.

On the other hand, the process parameters to be kept unchanged in the dry etching system are (1) high-frequency output, (2) wafer bias output, (3) flow rate of supplied gas, (4) inner pressure of the vacuum chamber (reactor), (5) temperature and flow rate of electrode cooling water, and (6) temperature and flow rate of water to adjust temperature of wall surfaces of the vacuum chamber (reactor). The energy controller 5, the utility controller 6, and the like controls these process parameters according to the numerical control information (control information) from the respective controllers.

The process parameters (1) to (6) are effective to prevent the lowering of the etching speed. However, when the high-frequency output of (1), the gas flow rate of (3), and/or the gas pressure of (4) become/becomes greater, the plasma characteristics change and the etching seeds are increased. As a result, although the etching speed is restored to the initial value, other process characteristics such as an etching contour and a ratio of an etching speed of an undercoating film and/or photo resist to the etching speed considerably are changed.

When the temperature of electrode cooling water of (5) becomes higher, reaction efficiency is improved and hence the etching speed is increased. However, this method is attended with a problem of difficulty in control due to a large value of time constant in the control system. This possibly leads to etching contour defects such as "side etch" and "notch" in some cases. For adjustment of the temperature of water to adjust wall surface temperature of (6), the time constant thereof is larger than that of the item (5) and hence it is impossible to appropriately conduct the control operation.

However, the inventors of the present invention have confirmed that in a method of increasing the wafer bias output of (2), the etching speed can be recovered almost without exerting any adverse influence upon the other process characteristics.

Consequently, in the controller, numerical information (detected information or measured value information) of voltage values regarding the wafer bias can be filtered to be extracted or determined before the other factors. It is therefore possible to exactly recognize changes in the characteristics associated with the etching speed. By keeping the voltage value of the wafer bias within a predetermined range through a control operation of the process parameters, it is possible to prevent changes in the characteristics associated with the etching speed.

For this purpose, at least one of the controllers includes an extracting section to extract (or a take-in section to take-in), from the numerical information, numerical information primarily exerting influence only upon predetermined process characteristics by, for example, a filtering operation and a control information generating section to generate control information to control, according to the extracted numerical information, energy to be supplied to the plasma utilizing equipment or the utilities of the plasma utilizing equipment (that is, to control the process parameter to keep the wafer bias voltage value within a predetermined range).

In another method, the member state detecting section 4 additionally includes a film thickness monitor (sensor) to measure an etching speed during an etching process. The film thickness monitor monitors thickness of a wafer to thereby monitor the etching speed by the controller. When the etching speed decreases, the controller accordingly increases the wafer bias output to prevent change in the characteristic of the etching speed to resultantly retain the initial characteristics for a long period of time.

Description will next be given of an example in which the embodiment of the controller for the plasma utilizing equipment is applied to a dry etching facility to fabricate holes in a $SiO_2$ film as an inter-layer insulation film. It is knows that when the hole manufacturing is successively conducted for $SiO_2$ wafers in a dry etching system, the etching speed as one process characteristic is lowered. The factors to influence the process characteristic are, for example, ① components of gas from reactive products accumulated by the processing in a reactor, ② reduction in an effective ground area of high-frequency discharge due to the accumulated reactive products, ③ change in impedance of an electrode and/or a reactor wall on which the reactive products are fixed, ④ quite small change of gas pressure due to increase in temperature of respective sections of the reactor, ⑤ change in impedance with respect to wafer bias due to the reactive products are fixed on an electrode surface on which a wafer is mounted, and ⑥ change of high-frequency output due to increase in temperature of atmosphere and/or the reactor.

On the other hand, the process parameters kept unchanged in the dry etching system are (1) high-frequency output, (2) wafer bias output, (3) flow rate of supplied gas, (4) inner pressure of the reactor, (5) temperature and flow rate of electrode cooling water, and (6) temperature and flow rate of water to adjust temperature of wall surfaces of the reactor.

To prevent the lowering of the etching speed, the process parameters (1) to (6) are effective. However, when the high-frequency output of (1) and/or the gas pressure of (4) become/becomes greater, the plasma characteristics change and the etching seeds are increased. Therefore, although the etching speed is restored to the initial value, the other process characteristics, i.e., the etching contour and the ratio of an etching speed of an undercoating film of photo resist to the etching speed considerably are changed. The wafer bias output of (2) is quite larger than the bias output in the etching of the poly-Si gate, if the wafer bias output is increased to restore the etching speed, the other process characteristic, i.e., the etching contour is considerably influenced. As already described, items (5) and (6) cannot be appropriately controlled due to a large time constant. However, the inventors of the present invention have found that in a method of (3), by slightly increasing the rate of oxygen gas in the supplied gas seeds including fluorocarbon and oxygen, the etching speed can be recovered almost without exerting any influence upon the other process characteristics.

Therefore, in the extracting section of the controller, by first extracting through a filtering operation the numerical information (detected information) about the oxygen concentration in the reactor before information of other components, it is possible to exactly determine change in the characteristic of the etching speed. Additionally, in the control information generating section, by controlling the etching parameters, according to the extracted numerical information, to keep the oxygen concentration in a predetermined range, it is possible to prevent change in the characteristic of the etching speed.

In still another method, like in the method above, there is arranged a film thickness monitor (sensor) to measure the etching speed during the etching process such that the controller monitors the etching speed detected by the film thickness monitor. According to any change in the etching speed, the controller slight increases or decreases the oxygen gas flow rate. This prevents change in the characteristic of the etching speed and hence the initial characteristics can be kept retained for a long period of time.

Subsequently, description will be given of operation of a dry etching system using the control apparatus for use with the plasma utilizing equipment is applied in which wiring of an aluminum alloy film is manufactured. It is known that when a wiring manufacturing process is successively conducted on an aluminum alloy film wafer in a dry etching system, one of the process characteristics, i.e., the etching contour is deteriorated, namely, a tapered sections appears. Factors exerting influence upon the process characteristics are, for example, ① components of gas from reactive products accumulated by the processing in a reactor, ② reduction in an effective ground area of high-frequency discharge due to the accumulated reactive products, ③ change in impedance of an electrode and/or a reactor wall on which the reactive products are fixed, ④ quite small change of gas pressure due to increase in temperature of respective sections of the reactor, ⑤ change in impedance with respect to wafer bias due to the reactive products are fixed on an electrode surface on which a wafer is mounted, and ⑥ change of high-frequency output due to increase in temperature of atmosphere and/or the reactor. Among these factors, the factor of ① components of gas from reactive products accumulated by the processing in a reactor has the strongest influence.

On the other hand, the process parameters kept unchanged are (1) high-frequency output, (2) wafer bias output, (3) flow rate of supplied gas, (4) inner pressure of the reactor, (5) temperature and flow rate of electrode cooling water, and (6) temperature and flow rate of water to adjust temperature of wall surfaces of the reactor. To prevent deterioration in the etching contour, the process parameters (1) to (6) are effective. However, when the high-frequency output of (1) and/or the wafer bias output of (2) become/becomes greater, a selection ratio with respect to resist is are strongly influenced. When the flow rate of supplied gas (3) is increased to relatively equalize gas components from the accumulated reactive products to those in the etching initial state, the deterioration in the etching contour can be prevented. However, since the state of plasma changes, the other process characteristics are influenced. As already described, items (5) and (6) cannot be appropriately controlled due to a large time constant. However, the inventors of the present invention have found that in the case of (4), by slightly decreasing the pressure in the reactor, the etching contour can be recovered almost without exerting any influence upon the other process characteristics. This indicates that content of each reactive product in the etching gas remaining in the reactor plays an important role.

Consequently, in the extracting section of the controller, by first extracting through a filtering operation the numerical information (detected information) about plasma emission intensity of carbon before information of other components, it is possible to exactly determine change in the characteristic of the etching speed. Moreover, in the control information generating section, by controlling the process parameters, according to the extracted numerical information, to keep an emission intensity ratio of carbon in a predetermined range, it is possible to prevent change in the etching characteristics.

In another method, the member state detecting section 4 further includes a size monitor (size sensor) to measure width of the wiring etched in the process such that the controller monitors the width of the wiring width. In accordance with magnitude of the tapered section in the etching contour, the controller slight lowers the inner pressure of the reactor. This prevents deterioration in the etching contour and hence the initial characteristics can be kept retained for a long period of time.

In the respective examples, the initial characteristics can also be kept retained for a long period of time not by disposing the respective monitors in the reactor, but by controlling by a program the pertinent control parameters according to information resultant from measurement in an offline state.

In the embodiment according to the present invention as described above, the measuring devices 3, 4, 13, 14, 15, 16, 17, 18, etc. to obtain numerical information necessary for control of a process control operation of plasma utilizing equipment are connected to the first communication link, a plurality of controllers 1, 7, 8, 9, etc. to conduct arithmetic operations according to the numerical information are connected to the second communication link, and a plurality of control devices 5, 6, etc. to receive the control numerical information generated from the controllers to carry out necessary control operations are connected to the third communication link. Resultantly, the controllers can freely receive the numerical information from various measuring devices to execute concurrent processing. Therefore, the processing can be executed at a high speed with high precision.

By executing a filtering operation for the measured numerical information according to primary factors of changes in the etching characteristics, it is possible to obtain numerical information with high precision and with high efficiency. It is consequently possible to conduct the manufacturing using plasma at a high speed with high precision while minimizing fluctuation of the plasma. This advantageously increases productivity.

In accordance with the embodiment described above, there is extracted one of the process characteristics which considerably hinders stability or process efficiency of the plasma processing in the plasma utilizing equipment, and then a plurality of process parameters which influence the extracted process characteristic are determined. From the process parameters, there is selected a process parameter least influencing the process characteristics other than the extracted process characteristics, not a process parameter most influencing the process characteristics other than the extracted process characteristics. The selected process parameter is called a first control parameter. Next, for any process characteristic hindering other stability in the plasma processing, a process parameter is selected in a similar procedure as a second parameter. By repeating the procedure, process parameters are selected for all process characteristics to be controlled. It is advisable to use, for example a Taguchi method to select the process parameters in a computer system. By controlling the selected process parameters, the process characteristics which hinder stability of the plasma processing can be controlled while minimizing interaction. The initial process characteristics can be kept unchanged for a long period of time.

Since the process parameters which least influence the other process characteristics are selected, the job to verify any changes with lapse of time of the plasma characteristics can be dispensed with. Furthermore, the changes in the plasma characteristics with respect to time of can be suppressed without directly controlling the overall plasma characteristics which have not been clarified yet.

Figure 2:
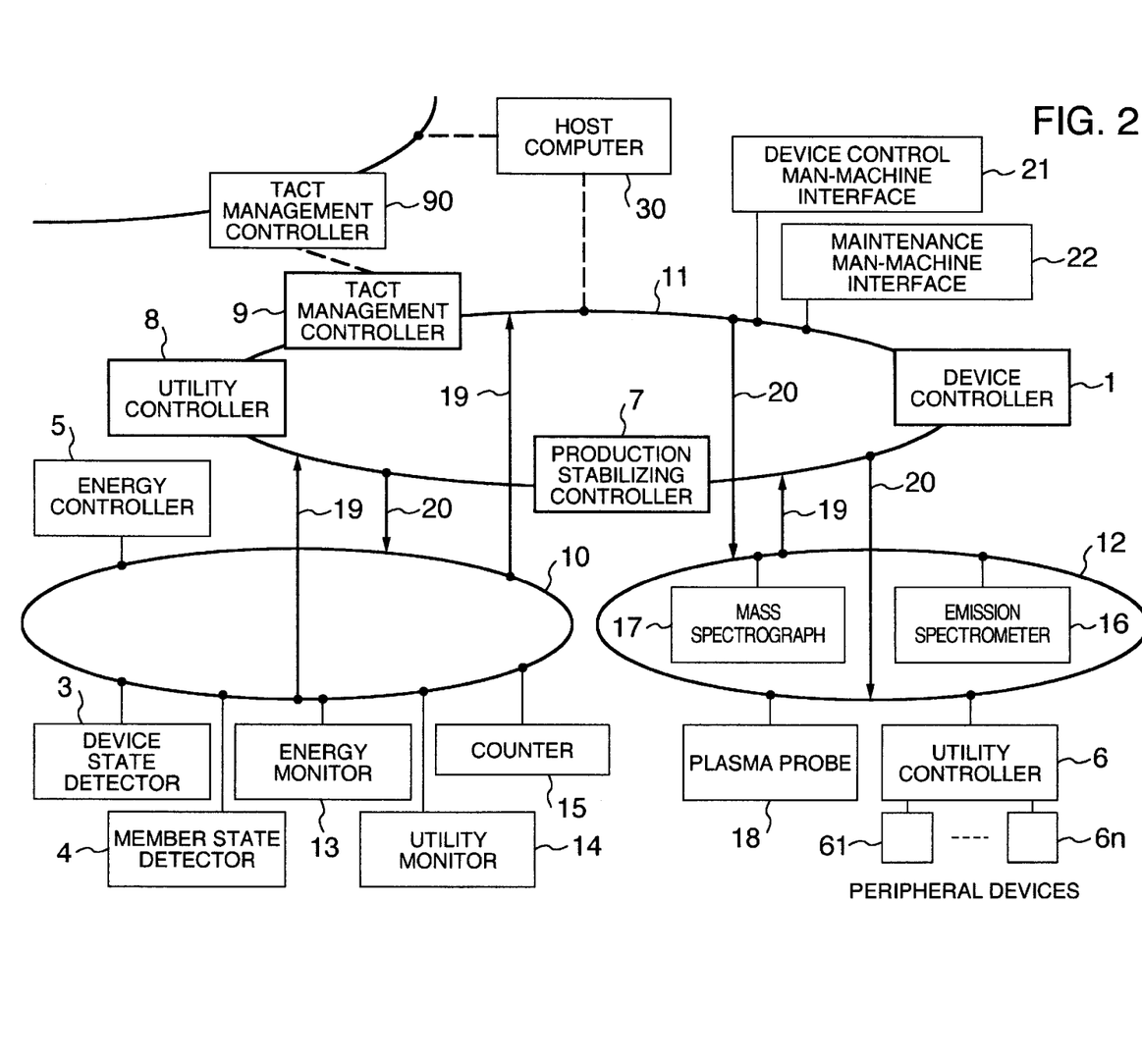
FIG. 2 is a diagram showing a second embodiment of a control apparatus of plasma utilizing equipment in accordance with the present invention.

Next, description will be given of a second embodiment of the present invention. FIG. 2 shows constitution of a second embodiment of a control apparatus for use with plasma utilizing equipment according to the present invention. In this embodiment, both of the control devices and measuring devices are distributively connected to the first and third communication links or the control devices or measuring devices are distributively connected to the first and third communication links.

In comparison, in the first embodiment, the measuring devices 3, 4, 13, 14, 15, 16, 17, 18, etc. to obtain numerical information necessary for control of a process control operation of plasma utilizing equipment are connected to the first communication link, a plurality of controllers to conduct arithmetic operations according to the numerical information are connected to the second communication link, and a plurality of control devices 5, 6, etc. to receive the control numerical information generated from the controllers to carry out necessary control operations are connected to the third communication link. In the second embodiment, as can be seen from FIG. 2, part (e.g., the measuring devices 3, 4, 13, 14, and 15) of the measuring devices 3, 4, 13, 14, 15, 16, 17, 18, etc. are connected to the first communication link and the other measuring devices (e.g., measuring devices 16, 17, and 18) are connected to the third communication link. Moreover, part of the control devices, for example, the control device 5 is connected to the first communication link and the remaining control device, e.g., the control device 6 is connected to the third communication link.

Also in this embodiment, an advantage as that of the first embodiment can be obtained. It is also possible that the measuring devices are distributed to the first and third communication links and all control devices are connected to the third communication link.

Figure 3:
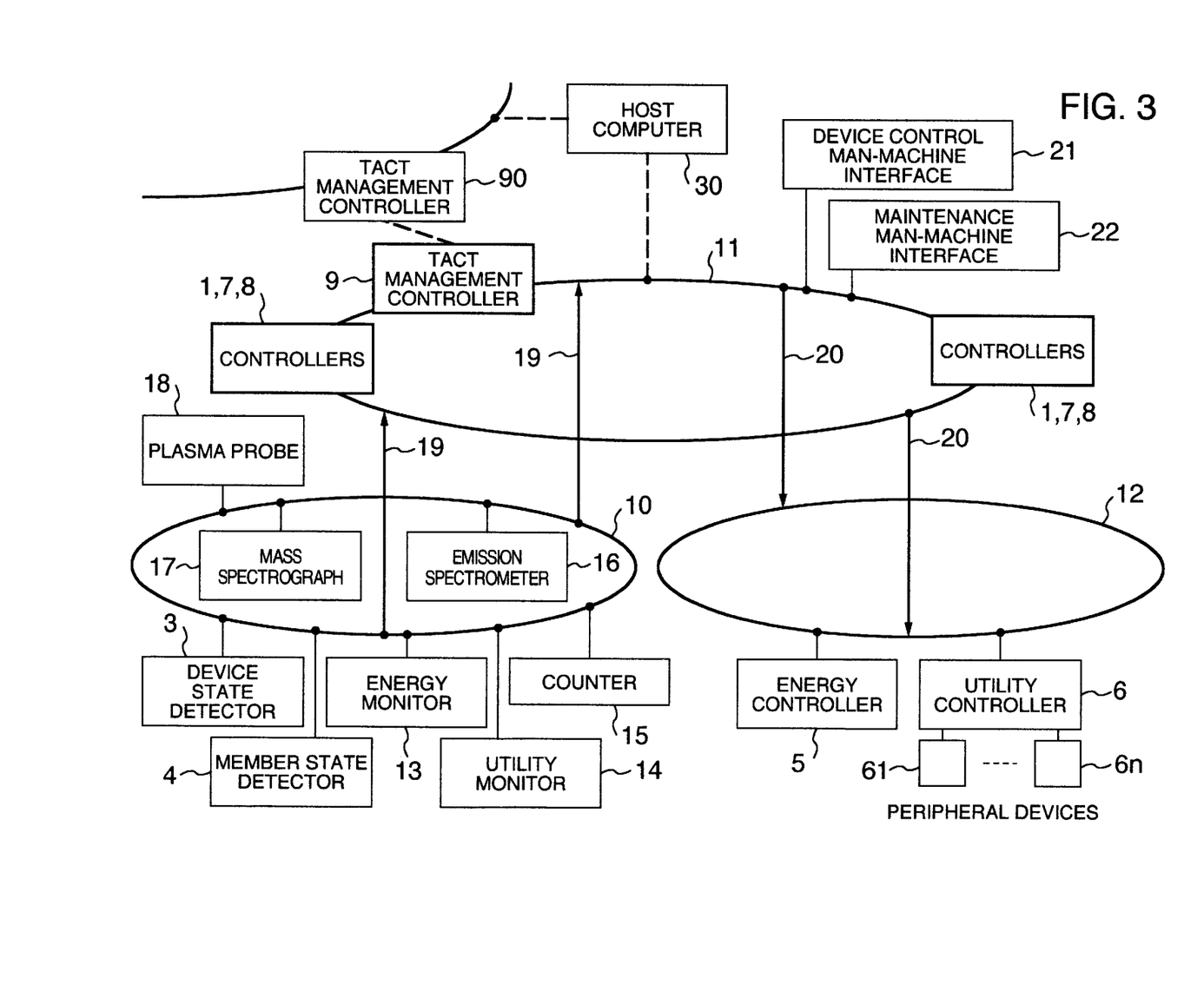
FIG. 3 is a diagram showing a third embodiment of a control apparatus of plasma utilizing equipment in accordance with the present invention.

Subsequently, description will be given of a third embodiment of the present invention. FIG. 3 shows a configuration of a third embodiment of a control apparatus for use with plasma utilizing equipment according to the present invention.

In this embodiment, at least one of the controllers 1, 7, 8, and 9, for example, the controllers 1, 7, and 8 are connected to the second communication link in a multiplexed configuration (in a duplicated configuration in the example of FIG. 3). When compared with the first and second embodiments, the controllers can achieve distributed processing performance in the duplicated fashion. Also in this mode, as in the second mode, it is also possible that both of the control devices and measuring devices are distributively connected to the first and third communication links or the control devices or measuring devices are distributively connected to the first and third communication links.

In accordance with the present invention described above, there can be provided a control apparatus for use with plasma utilizing equipment in which numerical information items measured by the measuring devices can be complementarily or associatively used and the control operation can be accomplished at a high speed with high precision.

Additionally, there can be provided a control apparatus for use with plasma utilizing equipment in which the control operation can be effectively conducted even when interaction takes place between the process parameters.

The specification and drawings are, accordingly, to be regarded in an illustrative rather than a restrictive sense. it will, however, be evident that various modifications and changes may be made thereto without departing from the broader spirit and scope of the invention as set forth in the claims.

What is claimed is:

1. A control apparatus for plasma utilizing equipment, comprising:

first, second, and third communication links which are connected to each other;

a plasma detecting section, connected to said first communication link, for detecting a state of plasma generated in a vacuum chamber of said plasma utilizing equipment;

a member state detecting section, connected to said first communication link, for detecting a state of a member to be processed, said member being disposed in said vacuum chamber;

a utility detecting section, connected to said first communication link for detecting a state of a utility of said plasma utilizing equipment;

a plurality of controllers each connected to said second communication link, and each generating control information for controlling energy to be supplied to said plasma utilizing equipment or a utility of said plasma utilizing equipment according to detected information detected by at least one arbitrarily selected detecting section of at least one said plasma detecting section, said member state detecting section, and said utility detecting section;

an energy control device, connected to said third communication link, for controlling energy to be supplied to said plasma utilizing equipment according to the control information; and a utility control device, connected to said third communication link, for controlling said utility according to the control information.

2. A control apparatus for plasma utilizing equipment according to claim 1, wherein one of said controllers generates the control information for controlling energy to be supplied to said plasma utilizing equipment or a utility of said plasma utilizing equipment according to control information generated by other one of the controllers.

3. A control apparatus for plasma utilizing equipment according to claim 1, wherein at least one of said controllers includes:

an extracting section for extracting detected information which primarily influences only predetermined process characteristics; and a control information generating section for generating control information for controlling energy to be supplied to said plasma utilizing equipment or a utility of said plasma utilizing equipment according to the detected information extracted by said detecting section.

4. A control apparatus for plasma utilizing equipment according to claim 3, wherein said extracting section includes a filtering section for extracting, from the control information generated by either one of said controllers, control information which primarily influences only predetermined process characteristics.

5. A control apparatus for plasma utilizing equipment according to claim 3, wherein:

said member state detecting section includes a detector for detecting a processing speed to etch a wafer as said member to be processed; and at least one of said controllers controls control information to control energy to be supplied to said plasma utilizing equipment or a utility of said plasma utilizing equipment according to the processing speed detected by the detector.

6. A control apparatus for plasma utilizing equipment according to claim 3, wherein said predetermined process characteristics are process characteristics which considerably hinder a process efficiency or stability of said plasma utilizing equipment.

7. A control apparatus for plasma utilizing equipment according to claim 1, wherein one of said controllers is a tact management controller which manages, in cooperation with a process of another processing apparatus, operation of the remaining ones of said controllers.

8. A control apparatus for plasma utilizing equipment according to claim 1, further comprising a high-level apparatus or a man-machine interface connected to said second communication link.

9. A control method for use with a control apparatus for plasma utilizing equipment including first, second, and third communication links which are connected to each other, a plasma detecting section connected to the first communication link for detecting a state of plasma generated in a vacuum chamber of the plasma utilizing equipment, a member state detecting section connected to the first communication link for detecting a state of a member to be processed, the member being disposed in the vacuum chamber; a utility detecting section connected to the first communication link for detecting a state of a utility of the plasma utilizing equipment, and a plurality of controllers each connected to the second communication link, comprising the steps of:

a) generating, by the controllers, control information to control energy to be supplied to the plasma utilizing equipment or a utility of the plasma utilizing equipment according to detected information detected by at least one arbitrarily detecting section of at least one of the plasma detecting section, the member state detecting section, and the utility detecting section;

b) controlling an energy control device connected to the third communication link to control energy to be supplied to the plasma utilizing equipment, by at least one of the controllers according to the control information; and c) controlling a utility control device connected to the third communication link to control the utility according to the control information, by at least one of the controllers according to the control information.

10. A control method according to claim 9, wherein said step a) includes extracting, from the detected information, detected information primarily influencing only predetermined process characteristics, and generating control information to control energy to be supplied to the plasma utilizing equipment or a utility of the plasma utilizing equipment according to the detected information thus extracted.

11. A control method according to claim 10, wherein said predetermined process characteristics are process characteristics considerably hindering stability of the plasma utilizing equipment.

12. A control apparatus for plasma utilizing equipment, comprising:

first, second, and third communication links which are connected to each other;

a plasma detecting section, connected to said first or third communication link, for detecting a state of plasma generated in a vacuum chamber of said plasma utilizing equipment;

a member state detecting section, connected to said first or third communication link, for detecting a state of a member to be processed, said member being disposed in said vacuum chamber;

a utility detecting section, connected to said first or third communication link, for detecting a state of a utility of said plasma utilizing equipment;

a plurality of controllers, each connected to said second communication link, and each generating control information for controlling energy to be supplied to said plasma utilizing equipment or a utility of said plasma utilizing equipment according to detected information detected by at least one arbitrarily detecting section of at least one of said plasma detecting section, said member state detecting section, and said utility detecting section;

an energy control device, connected to said first or third communication link, for controlling energy to be supplied to said plasma utilizing equipment according to the control information; and a utility control device, connected to said first or third communication link, for controlling said utility according to the control information.

13. A control apparatus for plasma utilizing equipment, comprising:

first, second, and third communication links which are connected to each other;

a plasma detecting section, connected to said first or third communication link, for detecting a state of plasma generated in a vacuum chamber of said plasma utilizing equipment;

a member state detecting section, connected to said first or third communication link, for detecting a state of a member to be processed, said member being disposed in said vacuum chamber;

a utility detecting section, connected to said first or third communication link, for detecting a state of a utility of said plasma utilizing equipment;

a plurality of multiplexed controllers, each connected to said second communication link, and each generating control information for controlling energy to be supplied to said plasma utilizing equipment or a utility of said plasma utilizing equipment according to detected information detected by at least one arbitrarily detecting section of at least one of said plasma detecting section, said member state detecting section, and said utility detecting section;

an energy control device, connected to said first or third communication link, for controlling energy to be supplied to said plasma utilizing equipment according to the control information; and a utility control device, connected to said first or third communication link, for controlling said utility according to the control information.

* * * * *